United States Patent
Darnell et al.

(10) Patent No.: US 9,705,180 B2
(45) Date of Patent: Jul. 11, 2017

(54) ANTENNA HAVING FLEXIBLE FEED STRUCTURE WITH COMPONENTS

(71) Applicant: Apple Inc., Cupertino, CA (US)

(72) Inventors: Dean F. Darnell, San Jose, CA (US); William J. Noellert, Sunnyvale, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 99 days.

(21) Appl. No.: 14/825,011

(22) Filed: Aug. 12, 2015

(65) Prior Publication Data
US 2015/0364813 A1    Dec. 17, 2015

Related U.S. Application Data

(63) Continuation of application No. 14/486,602, filed on Sep. 15, 2014, now Pat. No. 9,502,752, which is a
(Continued)

(51) Int. Cl.
*H01Q 1/24* (2006.01)
*H01Q 1/48* (2006.01)
(Continued)

(52) U.S. Cl.
CPC ............... *H01Q 1/243* (2013.01); *H01Q 1/48* (2013.01); *H01Q 1/50* (2013.01); *H01Q 9/045* (2013.01);
(Continued)

(58) Field of Classification Search
CPC   H01Q 1/24; H01Q 1/243; H01Q 1/48; H01Q 1/50; H01Q 9/045
See application file for complete search history.

(56) References Cited

U.S. PATENT DOCUMENTS

| 5,173,055 | A | 12/1992 | Grabbe |
| 5,583,523 | A | 12/1996 | Wallace |

(Continued)

FOREIGN PATENT DOCUMENTS

| CN | 101682119 | 3/2010 |
| CN | 201533015 | 7/2010 |

(Continued)

*Primary Examiner* — Hoang Nguyen
(74) *Attorney, Agent, or Firm* — Treyz Law Group, P.C.; G. Victor Treyz; Michael H. Lyons

(57) ABSTRACT

Electronic devices may include antenna structures. The antenna structures may form an antenna having first and second feeds at different locations. Transceiver circuitry for transmitting and receiving radio-frequency antenna signals may be mounted on one end of a printed circuit board. Transmission line structures may be used to convey signals between an opposing end of the printed circuit board and the transceiver circuitry. The printed circuit board may be coupled to an antenna feed structure formed from a flexible printed circuit using solder connections. The flexible printed circuit may have a bend and may be screwed to conductive electronic device housing structures using one or more screws at one or more respective antenna feed terminals. Electrical components such as an amplifier circuit and filter circuitry may be mounted on the flexible printed circuit.

19 Claims, 12 Drawing Sheets

Related U.S. Application Data continuation of application No. 13/435,351, filed on Mar. 30, 2012, now Pat. No. 8,836,587.

(51) Int. Cl.
  *H01Q 1/50* (2006.01)
  *H05K 1/02* (2006.01)
  *H05K 1/18* (2006.01)
  *H01Q 9/04* (2006.01)

(52) U.S. Cl.
  CPC ............. *H05K 1/028* (2013.01); *H05K 1/181* (2013.01); *H05K 1/189* (2013.01)

(56) References Cited

U.S. PATENT DOCUMENTS

| | | | |
|---|---|---|---|
| 6,075,713 A | 6/2000 | Lee et al. | |
| 6,259,407 B1 | 7/2001 | Tran | |
| 6,765,540 B2 | 7/2004 | Toncich | |
| 7,168,959 B2 | 1/2007 | Kuo et al. | |
| 7,179,126 B2 | 2/2007 | Chen | |
| 7,321,335 B2 | 1/2008 | Egorov | |
| 7,339,533 B2 | 3/2008 | Kurashima et al. | |
| 7,672,142 B2 | 3/2010 | Wang et al. | |
| 7,688,267 B2 | 3/2010 | Hill | |
| 7,705,795 B2 | 4/2010 | Chiang et al. | |
| 7,722,398 B2 | 5/2010 | Ma | |
| 7,724,530 B2 | 5/2010 | Clayton et al. | |
| 7,750,857 B2 | 7/2010 | Kim | |
| 7,808,434 B2 | 10/2010 | White et al. | |
| 7,876,274 B2 | 1/2011 | Hobson et al. | |
| 7,889,139 B2 | 2/2011 | Hobson et al. | |
| 8,050,313 B2 | 11/2011 | Constantinidis et al. | |
| 8,169,374 B2 | 5/2012 | Hill et al. | |
| 8,395,555 B2 | 3/2013 | Hobson et al. | |
| 9,287,627 B2 * | 3/2016 | Jarvis | H01Q 1/243 |
| 2004/0257283 A1 | 12/2004 | Asano et al. | |
| 2006/0178116 A1 | 8/2006 | Qi et al. | |
| 2008/0074329 A1 | 3/2008 | Caballero et al. | |
| 2008/0150815 A1 | 6/2008 | Nakahata et al. | |
| 2008/0316115 A1 | 12/2008 | Hill et al. | |
| 2008/0316117 A1 | 12/2008 | Hill et al. | |
| 2009/0065933 A1 | 3/2009 | Takehara et al. | |
| 2009/0153410 A1 | 6/2009 | Chiang et al. | |
| 2009/0174612 A1 | 7/2009 | Ayala et al. | |
| 2009/0256759 A1 | 10/2009 | Hill et al. | |
| 2009/0273523 A1 | 11/2009 | Sakuma | |
| 2010/0123632 A1 | 5/2010 | Hill et al. | |
| 2010/0248799 A1 | 9/2010 | Lum et al. | |
| 2010/0321255 A1 | 12/2010 | Kough et al. | |
| 2011/0156959 A1 | 6/2011 | Chiu et al. | |
| 2011/0183721 A1 | 7/2011 | Hill et al. | |
| 2011/0250928 A1 | 10/2011 | Schlub et al. | |
| 2011/0316751 A1 | 12/2011 | Jarvis et al. | |
| 2012/0009983 A1 | 1/2012 | Mow et al. | |
| 2012/0059075 A1 | 3/2012 | Prissok et al. | |
| 2012/0087065 A1 | 4/2012 | Kim et al. | |
| 2012/0112969 A1 | 5/2012 | Caballero et al. | |
| 2012/0157175 A1 | 6/2012 | Golko et al. | |
| 2012/0176278 A1 | 7/2012 | Merz et al. | |
| 2012/0176279 A1 | 7/2012 | Merz et al. | |
| 2012/0176754 A1 | 7/2012 | Merz et al. | |
| 2013/0194139 A1 | 8/2013 | Nickel et al. | |

FOREIGN PATENT DOCUMENTS

| | | |
|---|---|---|
| CN | 102394372 | 3/2012 |
| EP | 2109185 | 10/2009 |
| KR | 10/2012-0004338 | 1/2012 |

* cited by examiner

ANTENNA HAVING FLEXIBLE FEED STRUCTURE WITH COMPONENTS

This application is a continuation of U.S. patent application Ser. No. 14/486,602, filed Sep. 15, 2014, which is a continuation of U.S. patent application Ser. No. 13/435,351, filed Mar. 30, 2012. This application claims the benefit of and claims priority to U.S. patent application Ser. No. 14/486,602, filed Sep. 15, 2014 and U.S. patent application Ser. No. 13/435,351, filed Mar. 30, 2012, which are hereby incorporated by reference herein in their entireties.

BACKGROUND

This relates generally to electronic devices, and more particularly, to antenna structures for electronic devices with wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. At the same time, it may be desirable to include conductive structures in an electronic device such as metal device housing components. Because conductive components can affect radio-frequency performance, care must be taken when incorporating antennas into an electronic device that includes conductive structures. Moreover, care must be taken to ensure that the antennas and wireless circuitry in a device are able to exhibit satisfactory performance over a range of operating frequencies.

It would therefore be desirable to be able to provide improved antenna structures for wireless electronic devices.

SUMMARY

Electronic devices may include antenna structures. The antenna structures may be formed from antenna resonating element and ground structures. The antenna resonating element structures may be formed from conductive portions of an electronic device housing such as peripheral conductive housing structures. The ground structures may include housing structures, printed circuit board traces, and other conductive structures. The ground structures associated with an antenna may be separated from peripheral conductive housing structures or other antenna resonating element structures by a gap.

The antenna structures may form an antenna having a single feed or having first and second feeds at different locations. Transceiver circuitry for transmitting and receiving radio-frequency antenna signals may be mounted on a first end of a printed circuit board. Transmission line structures may be used to convey signals between an opposing second end of the printed circuit board and the first end of the printed circuit board.

The printed circuit board may be coupled to an antenna feed structure formed from a flexible printed circuit using solder connections. The flexible printed circuit may have a bend. One edge of the flexible printed circuit may be coupled to the printed circuit board using the solder connections or other electrical connections. The other edge of the flexible printed circuit may be attached to the vertical inner surface of a peripheral conductive housing structure or other antenna resonating element structure. The flexible printed circuit may, for example, be screwed to the conductive electronic device housing structures using one or more screws at one or more antenna feed terminals.

Electrical components such as an amplifier circuit and filter circuitry may be mounted on the flexible printed circuit.

Further features of the invention, its nature and various advantages will be more apparent from the accompanying drawings and the following detailed description of the preferred embodiments.

DETAILED DESCRIPTION

Figure 1:
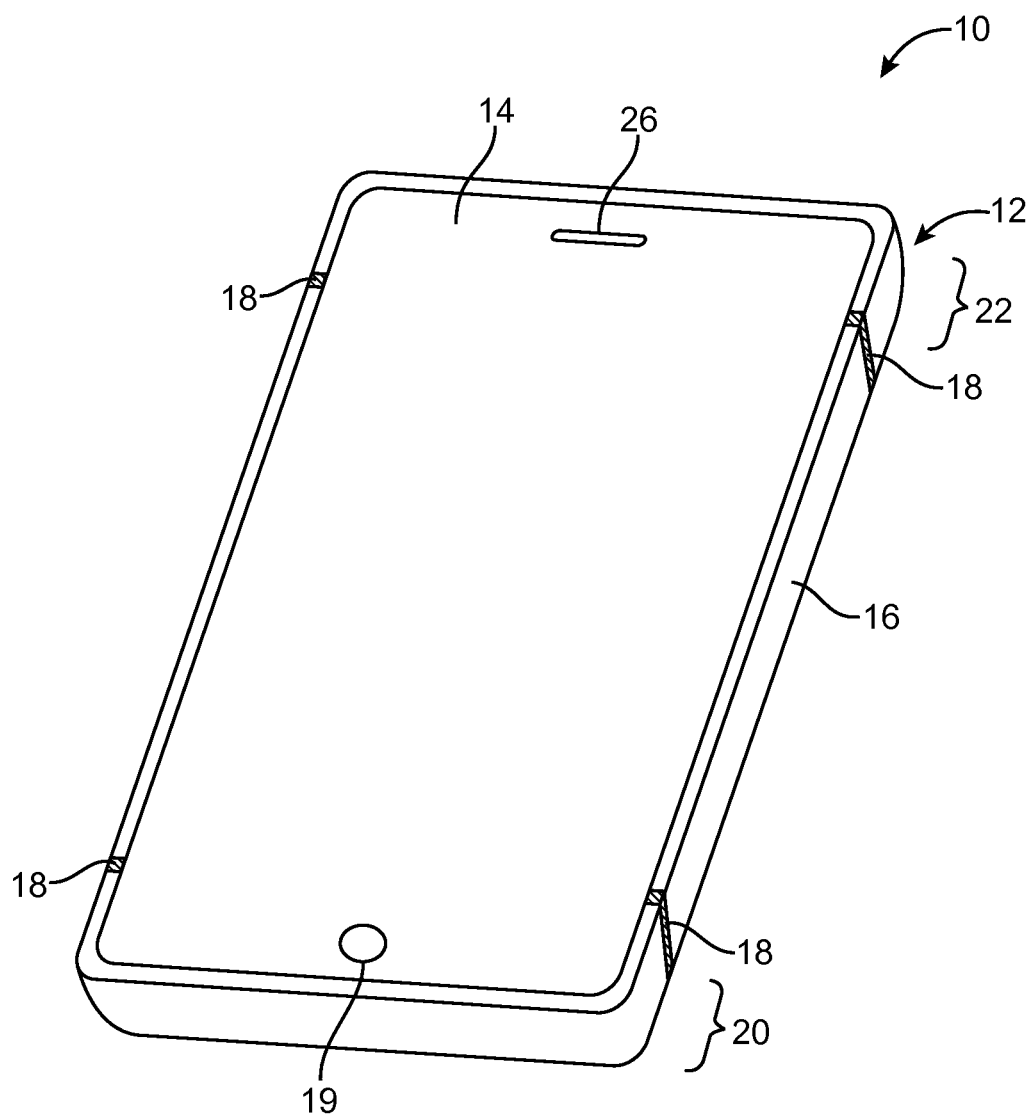
FIG. 1 is a perspective view of an illustrative electronic device with wireless communications circuitry in accordance with an embodiment of the present invention.

Electronic devices such as electronic device 10 of FIG. 1 may be provided with wireless communications circuitry. The wireless communications circuitry may be used to support wireless communications in one or more wireless communications bands. The wireless communications circuitry may include one or more antennas.

The antennas can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures. The conductive electronic device structures may include conductive housing structures. The housing structures may include a peripheral conductive structure that runs around the periphery of an electronic device. The peripheral conductive structure may be formed from a separate rectangular-ring-shaped member or some or all of the peripheral conductive structure may be formed as an integral portion of a rear housing plate (as examples). The peripheral conductive structure, which may sometimes be referred to as a peripheral conductive member or peripheral housing structures, may serve as a bezel for a planar structure such as a display, may serve as sidewall structures for a device housing, and/or may form other housing structures. Gaps in the peripheral conductive member may be associated with antennas in device 10.

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, or a media player. Device 10 may also be a television, a set-top box, a desktop computer, a computer monitor into which a computer has been integrated, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. For example, glass structures, plastic structures, or other dielectric structures may be used to form exterior and interior portions of housing 12. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electrowetting pixels, electrophoretic pixels, liquid crystal display (LCD) components, or other suitable image pixel structures. A cover glass layer may cover the surface of display 14. Buttons such as button 19 may pass through openings in the cover glass. The cover glass may also have other openings such as an opening for speaker port 26.

Housing 12 may include peripheral conductive portions. For example, housing 12 may include peripheral conductive structures such as peripheral conductive member 16. Member 16 may run around the periphery of device 10 and display 14. Member 16 or portions of member 16 may form an integral part of a planar rear housing structure (e.g., a planar rear housing wall) and/or separate housing structures. In configurations in which device 10 and display 14 have a rectangular shape, member 16 may have a rectangular ring shape (as an example). Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10 (e.g., by forming a metal band with vertical sidewalls, by forming sidewalls that extend vertically from a planar rear housing member, etc.).

Member 16 may be formed of a conductive material and may therefore sometimes be referred to as a peripheral conductive member, peripheral conductive structures, or conductive housing structures. Member 16 may be formed from a metal such as stainless steel, aluminum, or other suitable materials. One, two, or more than two separate structures may be used in forming member 16.

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of housing 12 of the sidewalls of housing 12).

Display 14 may include conductive structures such as an array of capacitive electrodes, conductive lines for addressing pixel elements, driver circuits, etc. Housing 12 may include internal structures such as metal frame members, a planar interior housing member (sometimes referred to as a midplate) that spans the walls of housing 12 (i.e., one or more sheet metal structures that form a substantially rectangular member that is welded or otherwise connected between opposing sides of member 16), a planar rear housing wall, printed circuit boards, and other conductive structures. These conductive structures may be located in the center of housing 12 under display 14 (as an example).

In regions 22 and 20, openings (gaps) may be formed within the conductive structures of device 10 (e.g., between peripheral conductive member 16 and opposing conductive structures such as conductive housing structures, a conductive ground plane associated with a printed circuit board, a conductive rear housing wall, conductive components such as a display, and other conductive electrical components in device 10). These openings may be filled with air, plastic, and other dielectrics. Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

In general, device 10 may include any suitable number of antennas (e.g., one or more, two or more, three or more, four or more, etc.). The antennas in device 10 may be located at opposing first and second ends of an elongated device housing, along one or more edges of a device housing, in the center of a device housing, in other suitable locations, or in one or more of such locations. The arrangement of FIG. 1 is merely illustrative.

Portions of member 16 may be provided with gap structures. For example, member 16 may be provided with one or more gaps such as gaps 18, as shown in FIG. 1. The gaps may be filled with dielectric such as polymer, ceramic, glass, air, other dielectric materials, or combinations of these materials. Gaps 18 may divide peripheral conductive member 16 (e.g., the sidewalls of housing 12) into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10.

In a typical scenario, device 10 may have upper and lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
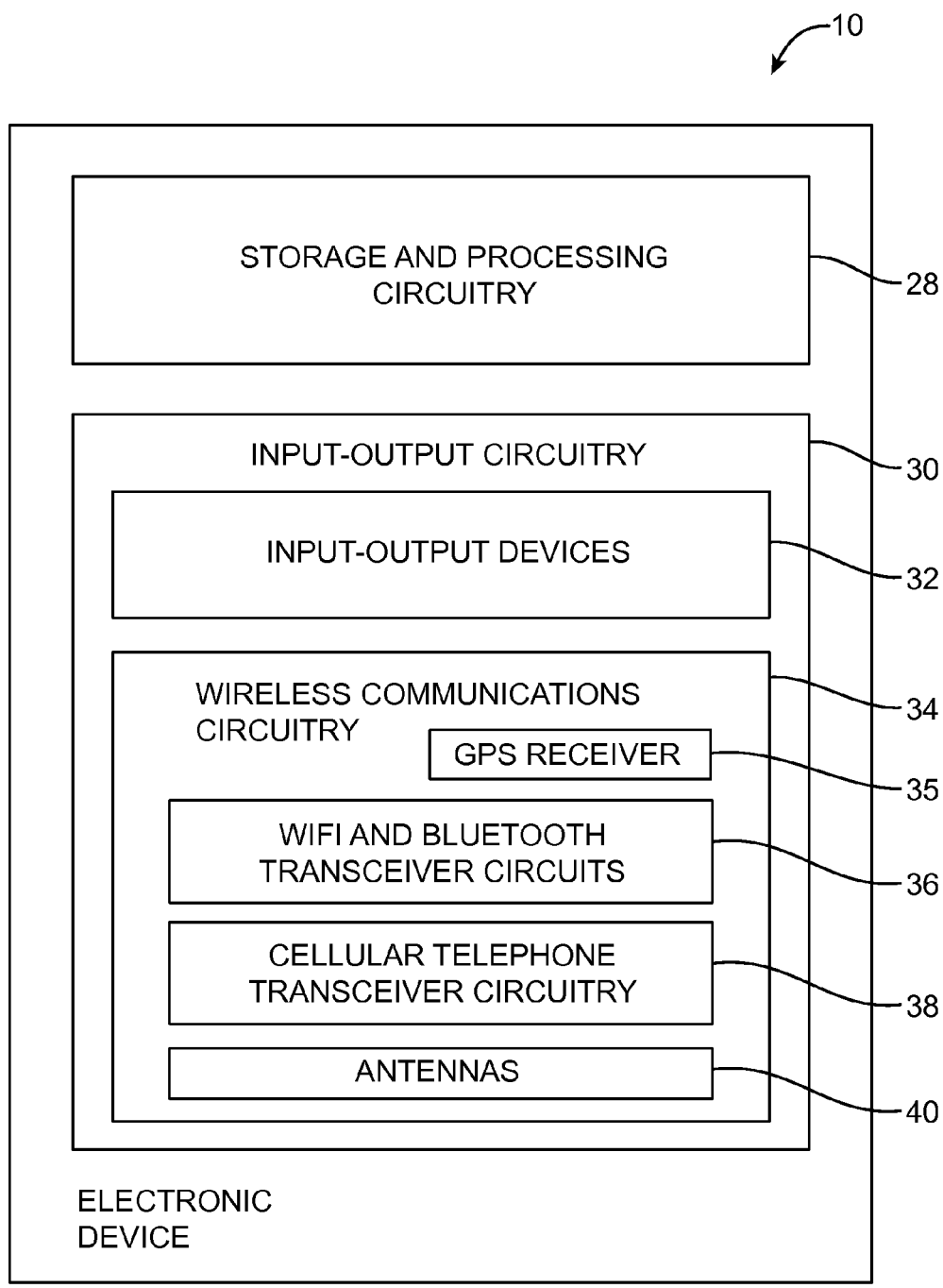
FIG. 2 is a schematic diagram of an illustrative electronic device with wireless communications circuitry in accordance with an embodiment of the present invention.

A schematic diagram of an illustrative configuration that may be used for electronic device 10 is shown in FIG. 2. As shown in FIG. 2, electronic device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. The processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may be configured to implement control algorithms that control the use of antennas in device 10. For example, circuitry 28 may perform signal quality monitoring operations, sensor monitoring operations, and other data gathering operations and may, in response to the gathered data and information on which communications bands are to be used in device 10, control which antenna structures within device 10 are being used to receive and process data and/or may adjust one or more switches, tunable elements, or other adjustable circuits in device 10 to adjust antenna performance. As an example, circuitry 28 may control which of two or more antennas is being used to receive incoming radio-frequency signals, may control which of two or more antennas is being used to transmit radio-frequency signals, may control the process of routing incoming data streams over two or more antennas in device 10 in parallel, may tune an antenna to cover a desired communications band, etc. In performing these control operations, circuitry 28 may open and close switches, may turn on and off receivers and transmitters, may adjust impedance matching circuits, may configure switches in radio-frequency circuits that are interposed between radio-frequency transceiver circuitry and antenna structures (e.g., filtering and switching circuits used for impedance matching and signal routing), may adjust switches, tunable circuits, and other adjustable circuit elements that are formed as part of an antenna or that are coupled to an antenna or a signal path associated with an antenna, and may otherwise control and adjust the components of device 10.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 34 may include satellite navigation system receiver circuitry 35 such as Global Positioning System (GPS) receiver circuitry (e.g., for receiving satellite positioning signals at 1575 MHz) or satellite navigation system receiver circuitry associated with other satellite navigation systems. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands in frequency ranges of about 700 MHz to about 2200 MHz or bands at higher or lower frequencies. Wireless communications circuitry 34 can include circuitry for other short-range and long-range wireless links if desired. For example, wireless communications circuitry 34 may include wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link.

If desired, antennas 40 may include adjustable components so that antennas 40 can be tuned to cover desired communications bands of interest. Each of antennas 40 may have a single antenna feed or may have multiple antenna feeds. For example, an antenna with multiple feeds may have a first antenna feed that is associated with a first set of communications frequencies and a second antenna feed that is associated with a second set of communications frequencies. The use of multiple feeds (and/or adjustable antenna components) may make it possible to reduce antenna size (volume) within device 10 while satisfactorily covering desired communications bands.

Figure 3:
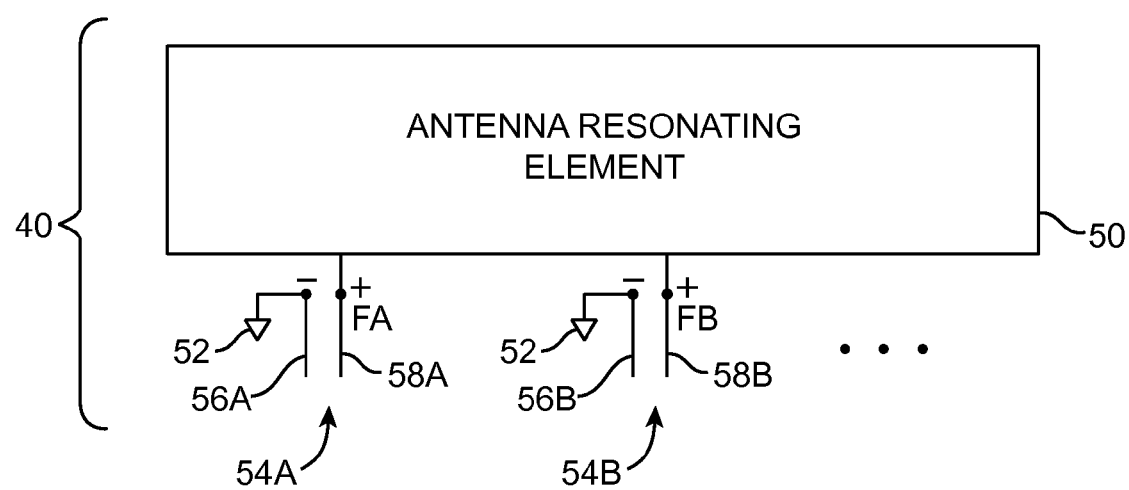
FIG. 3 is a diagram of an illustrative antenna structure in accordance with an embodiment of the present invention.

An illustrative configuration for an antenna of the type that may be used in device 10 is shown in FIG. 3. Antenna 40 of FIG. 3 may have one or more antenna feeds. As shown in FIG. 3, antenna 40 may have conductive antenna structures such as antenna resonating element 50 and antenna ground 52. The conductive structures that form antenna resonating element 50 and antenna ground 52 may be formed from parts of conductive housing structures, from parts of electrical device components in device 10, from printed circuit board traces (e.g., conductive lines such as conductive paths formed from metal), from strips of conductor such as strips of wire and metal foil, or other conductive materials.

Each antenna feed associated with antenna 40 may, if desired, have a distinct location. As shown in FIG. 3, antenna 40 may have a first feed such as feed FA at a first location in antenna 40, a second feed such as feed FB at a second location in antenna 40, and one or more additional antenna feeds at potentially different respective locations of antenna 40.

Each of the one or more feeds associated with antenna 40 may be coupled to an associated set of conductive signal paths using terminals such as positive antenna feed terminals (+) and ground antenna feed terminals (−). For example, path 54A may have a positive conductor 58A that is coupled to a positive antenna feed terminal in feed FA and a ground conductor 56A that is coupled to a ground antenna feed terminal in feed FA, whereas path 54B may have a positive conductor 58B that is coupled to a positive antenna feed terminal in feed FB and a ground conductor 56B that is coupled to a ground antenna feed terminal in feed FB. Paths such as paths 54A and 54B may be implemented using transmission line structures such as coaxial cables, microstrip transmission lines (e.g., microstrip transmission lines on printed circuits), stripline transmission lines (e.g., stripline transmission lines on printed circuits), or other transmission lines or signal paths. Circuits such as impedance matching and filter circuits and other circuitry may be interposed within paths 54A and 54B.

Paths such as paths 54A and 54B may be used to couple antenna feeds for one or more antennas 40 to radio-frequency transceiver circuitry such as receiver (transceiver) 35 and transceivers 36 and/or 38 of FIG. 2. Path 54A may include one or more transmission line segments and may include positive conductor 56A and ground conductor 58A. Path 54B may include one or more transmission line segments and may include positive conductor 56B and ground conductor 58B. One or more circuits such as filter circuits, impedance matching circuits, switches, amplifier circuits, and other circuits may be interposed within paths 54A and 54B.

With one illustrative configuration, a first path such as path 54A may be coupled between a first radio-frequency transceiver circuit and first antenna feed FA and a second path such as path 54B may be used to couple a second radio-frequency transceiver circuit to second antenna feed FB. Feeds FA and FB may be used in transmitting and/or receiving radio-frequency antenna signals. The first transceiver may include a radio-frequency receiver and/or a radio-frequency transmitter. The second transceiver may also include a radio-frequency receiver and/or a radio-frequency transmitter.

The first transceiver may, as an example, be a transceiver such as a satellite navigation system receiver and the second transceiver may, as an example, be a transceiver such as a cellular telephone transceiver (having a cellular telephone transmitter and a cellular telephone receiver). As another example, the first transceiver may have a transmitter and/or a receiver that operate at frequencies associated with a first communications band (e.g., a first cellular or wireless local area network band) and the second transceiver may have a transmitter and/or a receiver that operate at frequencies associated with a second communications band (e.g., a second cellular or wireless local area network band). Other types of configurations may be used, if desired. The transceivers may be implemented using separate integrated circuits or may be integrated into a common integrated circuit (as examples). One or more associated additional integrated circuits (e.g., one or more baseband processor integrated circuits) may be used to provide the transceiver circuitry with data to be transmitted by antenna 40 and may be used to receive and process data that has been received by antenna 40.

Filter circuitry, impedance matching circuitry, switches, amplifiers, and other electrical components may be interposed in paths such as paths 54A and 54B. For example, a first filter may be interposed in path 54A between feed FA and a first transceiver, so that signals that are transmitted and/or received using antenna feed FA are filtered by the first filter. A second filter may likewise be interposed in path 54B, so that signals that are transmitted and/or received using antenna feed FB are filtered by the second filter. The filters may be adjustable or fixed. In fixed filter configurations, the transmittance of the filters as a function of signal frequency is fixed. In adjustable filter configurations, adjustable components may be placed in different states to adjust the transmittance characteristics of the filters.

If desired, fixed and/or adjustable impedance matching circuits (e.g., circuitry for impedance matching a transmission line to antenna 40 or other wireless circuitry) may be included in paths 54A and 54B (e.g., as part of filters or as separate circuits). In a multi-feed antenna, the first and second filters may be configured so that the antenna feeds in the antenna may operate satisfactorily, even in a configuration in which multiple feeds are coupled to antenna 40 simultaneously.

Figure 4:
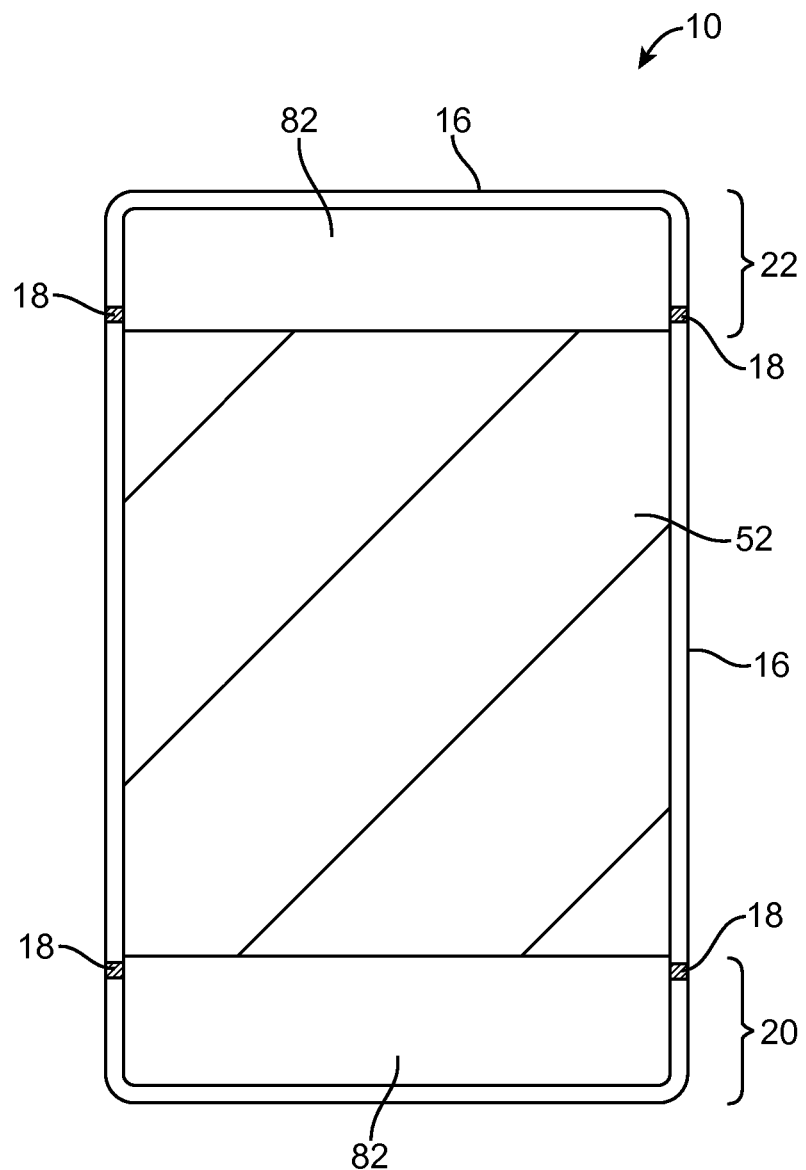
FIG. 4 is a diagram of an illustrative electronic device of the type shown in FIG. 1 showing how structures in the device may form a ground plane and antenna resonating element structures in accordance with an embodiment of the present invention.

A top interior view of device 10 in a configuration in which device 10 has a peripheral conductive structure such as peripheral conductive housing member 16 of FIG. 1 with one or more gaps 18 is shown in FIG. 4. As shown in FIG. 4, device 10 may have an antenna ground plane such as antenna ground plane 52. Ground plane 52 may be formed from traces on printed circuit boards (e.g., rigid printed circuit boards and flexible printed circuit boards), from conductive planar support structures in the interior of device 10, from conductive structures that form exterior parts of housing 12 (e.g., some or all of a conductive rear housing wall structure), from conductive structures that are part of one or more electrical components in device 10 (e.g., parts of connectors, switches, cameras, speakers, microphones, displays, buttons, etc.), or other conductive device structures. Gaps such as gaps 82 may be filled with air, plastic, or other dielectric.

One or more segments of peripheral conductive member 16 may serve as antenna resonating elements such as antenna resonating element 50 of FIG. 3. For example, the uppermost segment of peripheral conductive member 16 in region 22 may serve as an antenna resonating element for an antenna in device 10. The conductive materials of peripheral conductive member 16, the conductive materials of ground plane 52, and dielectric openings (gaps) 82 (and gaps 18) may be used in forming one or more antennas in device 10 such as an upper antenna in region 22 and a lower antenna in region 20. Antennas in regions 20 and 22 may each have a single feed or multiple feeds.

Figure 5:
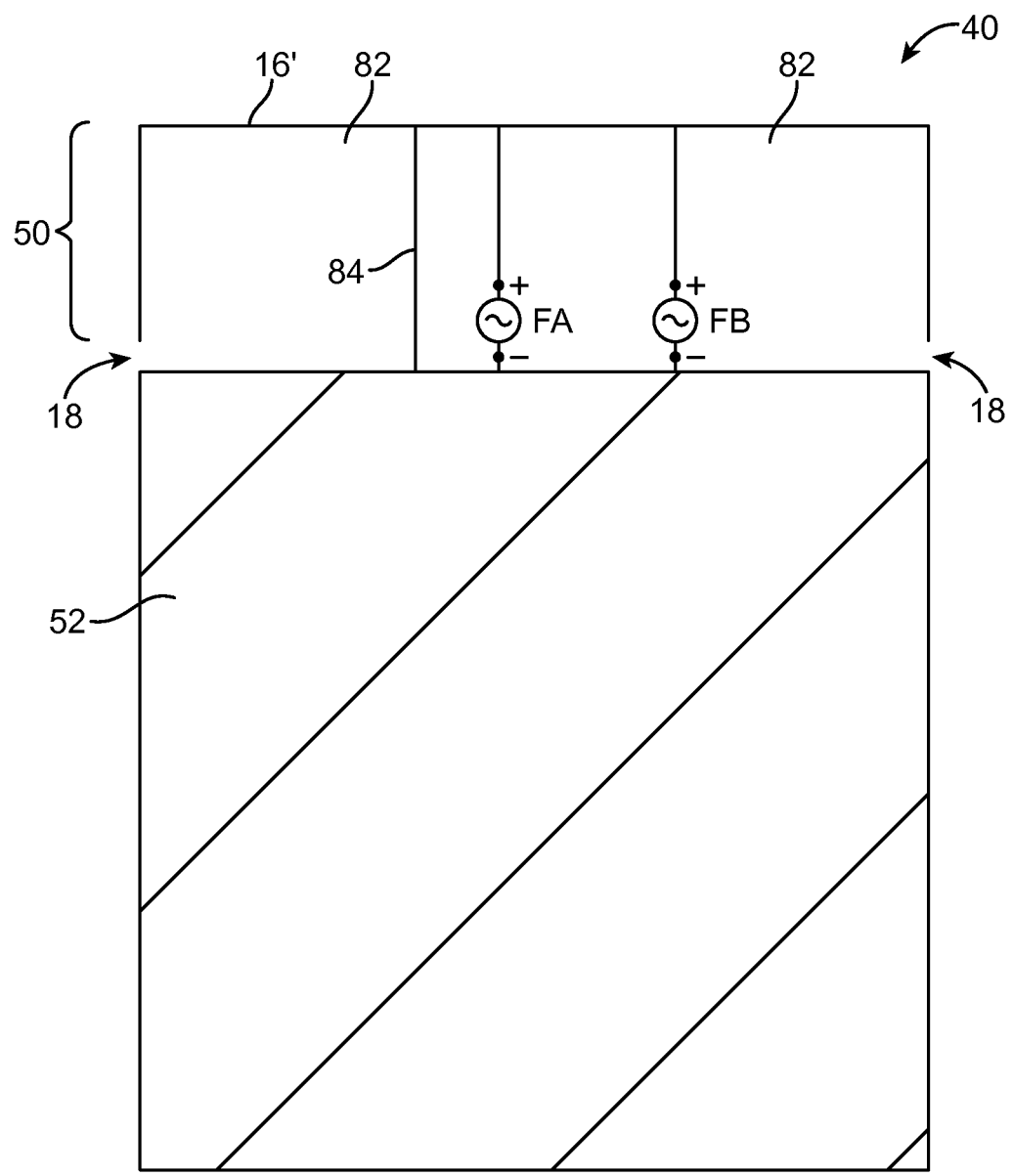
FIG. 5 is a diagram showing how device structures of the type shown in FIG. 4 may be used in forming an antenna with multiple feeds in accordance with an embodiment of the present invention.

Using a device configuration of the type shown in FIG. 5, a dual-feed antenna for device 10 may be implemented (e.g., a dual-feed inverted-F antenna). Segment 16' of the peripheral conductive member (see, e.g., peripheral conductive structures 16 of FIG. 4) may form antenna resonating element 50. Ground plane 52 may be separated from antenna resonating element 50 by gap 82. Gaps 18 may be formed at either end of segment 16' and may have associated parasitic capacitances. Conductive path 84 may form a short circuit path between antenna resonating element 50 (i.e., segment 16') and ground 52. First antenna feed FA and second antenna feed FB may be located at different locations along the length of antenna resonating element 50.

Figure 6:
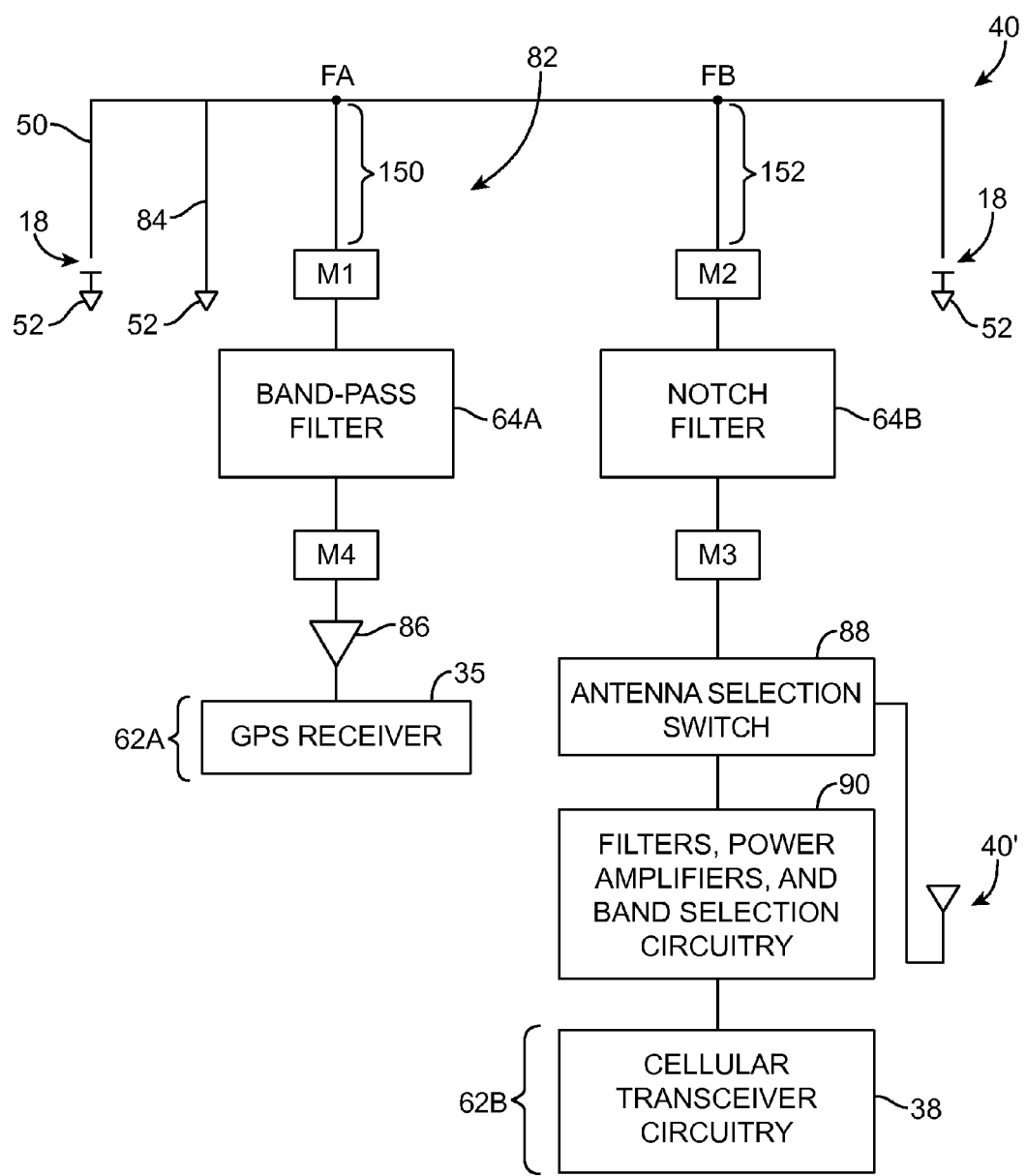
FIG. 6 is a diagram of an antenna of the type shown in FIG. 5 with multiple feeds and associated wireless circuitry such as filters and matching circuits in accordance with an embodiment of the present invention.

As shown in FIG. 6, it may be desirable to provide each of the feeds of antenna 40 with filter circuitry and impedance matching circuitry. In a configuration of the type shown in FIG. 6, antenna resonating element 50 may be formed from a segment of peripheral conductive member 16 (e.g., segment 16' of FIG. 5). Antenna ground 52 may be formed from ground plane structures such as ground plane structure 52 of FIG. 5. Antenna 40 of FIG. 6 may be, for example, an upper antenna in region 22 of device 10 (e.g., an inverted-F antenna). Device 10 may also have additional antennas such as antenna 40' (e.g., an antenna formed in lower portion 20 of device 10, as shown in FIG. 4).

In the illustrative example of FIG. 6, satellite navigation receiver 35 (e.g., a Global Positioning System receiver or a receiver associated with another satellite navigation system or other type of transceiver) may serve as a first transceiver for device 10, whereas cellular telephone transceiver circuitry 38 (e.g., a cellular telephone transmitter and a cellular telephone receiver or another type of transceiver) may serve as a second transceiver for device 10. If desired, other types of transceiver circuitry may be used in device 10. The example of FIG. 6 is merely illustrative.

As shown in FIG. 6, receiver 35 may be coupled to antenna 40 at first antenna feed FA and transceiver 38 may be coupled to antenna 40 at second antenna feed FB.

Incoming signals for receiver 35 may be received through band-pass filter 64A, optional impedance matching circuits such as matching circuits M1 and M4, and low noise amplifier 86. The signals received from feed FA may be conveyed through components such as matching filter M1, band-pass filter 64A, matching circuit M4, and low noise amplifier 86 using transmission lines paths such as transmission line path 54A. Additional components may be interposed in transmission line path 54A, if desired.

Signals associated with transmit and receive operations for cellular transceiver circuitry 38 may be handled using notch filter 64B, optional impedance matching circuits such as matching circuits M2 and M3, antenna selection switch 88, and circuitry 90. Antenna selection switch 88 may have a first state in which antenna 40 is coupled to transceiver 38 and a second state in which antenna 40' is coupled to transceiver 38 (as an example). If desired, switch 88 may be a cross-bar switch that couples either antenna 40 or antenna 40' to transceiver 38 while coupling the remaining antenna to another transceiver.

Circuitry 90 may include filters (e.g., duplexers, diplexers, etc.), power amplifier circuitry for amplifying transmitted signals, band selection switches, and other components. The components used in transmitting and receiving signals with feed FB may be conveyed through components such as matching filter M2, notch filter 64B, matching circuit M3, and circuitry 90 using transmission lines paths such as transmission line path 54B (see, e.g., FIGS. 3 and 9). Additional components may be interposed in transmission line path 54B, if desired.

Figure 7:
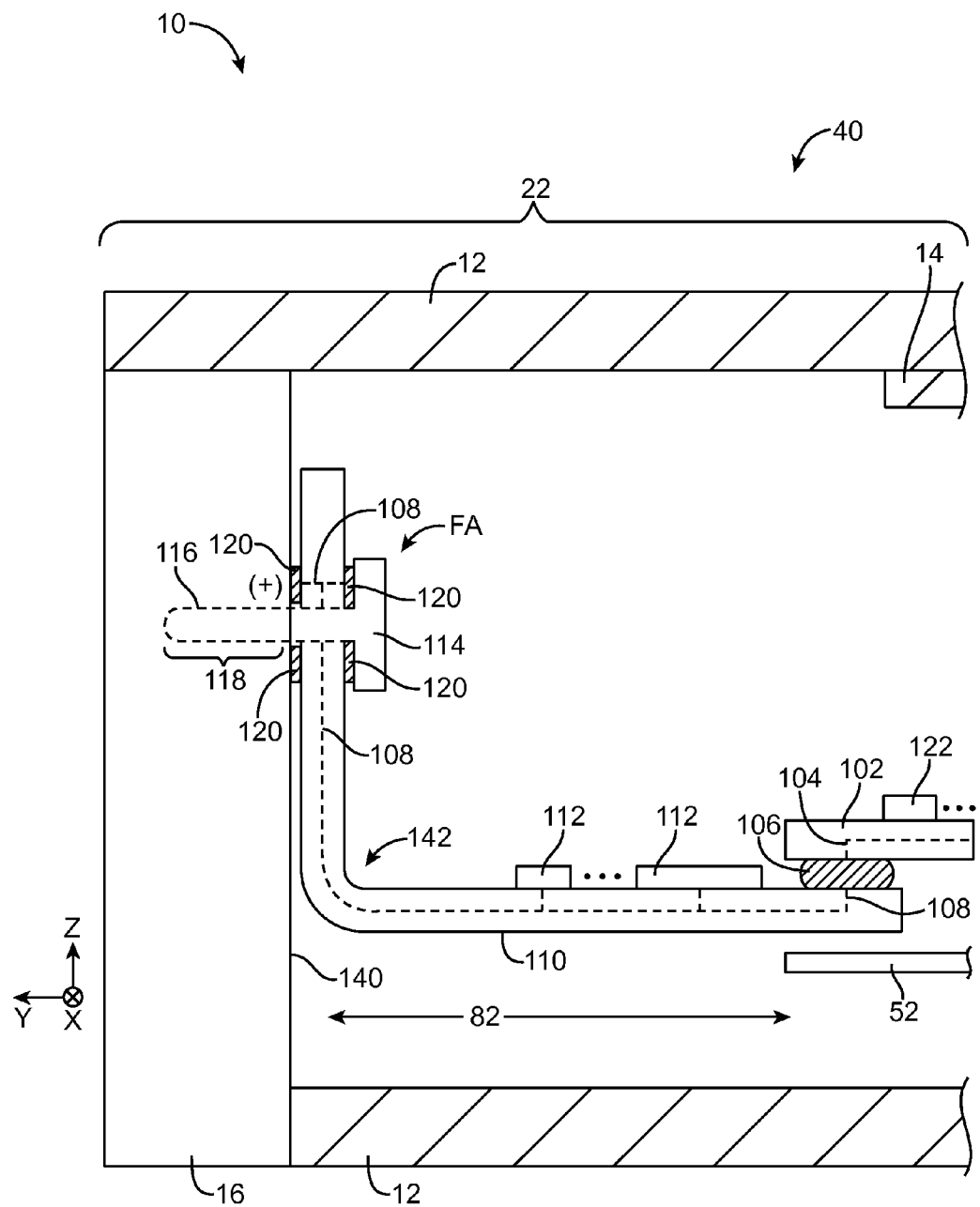
FIG. 7 is a cross-sectional side view of a portion of a device of the type shown in FIG. 4 showing how an antenna feed may be formed using a flexible printed circuit that spans a gap between a printed circuit board and a peripheral conductive housing structure in accordance with an embodiment of the present invention.

FIG. 7 is a cross-sectional side view of a portion of device 10 in the vicinity of upper region 22. Housing structures 12 may include upper housing structure 12A (e.g., a display cover layer such as a layer of cover glass, transparent plastic, or other clear material). Housing structure 12A may cover display module 14. Gap 82 may separate the edge of display 14 and peripheral conductive housing structure 16.

Antenna 40 may include an antenna resonating element formed from a segment of peripheral conductive structures 16 and a ground such as ground plane 52. Ground plane 52 may include conductive housing structures (e.g., sheet metal structures), electrical components, conductive traces on printed circuit boards, and other conductive materials.

As shown in FIG. 7, device 10 may include a printed circuit board such as printed circuit board 102. Printed circuit board 102 may be used to mount electrical components 122 such as integrated circuits and other circuits. Conductive traces 104 may form interconnects that interconnect electrical components 122 with each other. The interconnects in board 102 may also form signal paths for antenna signals associated with antenna 40. As shown in FIG. 7, for example, traces 104 on printed circuit board 102 may be electrically connected to traces 108 on printed circuit 110 using solder connections such as solder connection 106. If desired, a connector (e.g., a board-to-board connector or other suitable connector) may be used in connecting traces 104 on printed circuit board 102 and traces 108 of printed circuit 110. Welds, conductive adhesive, and other electrical connections may also be used, if desired. The use of solder connections in the configuration of FIG. 7 is merely illustrative.

Printed circuit board 102 may be, for example, a rigid printed circuit board such as a printed circuit board formed from fiberglass-filled epoxy (e.g., FR4), a flexible printed circuit, a plastic substrate, a substrate formed from other suitable dielectrics, or other suitable substrate. Traces and components on printed circuit board 102 may form part of antenna ground 52.

Printed circuit 110 may be a flexible printed circuit ("flex circuit") formed from a flexible sheet of polymer such as a layer of polyimide or other suitable dielectric substrate. Printed circuit 110 may, as an example, have a thickness of less than 0.5 mm, less than 0.2 mm, or 0.1 mm (as examples). Components 112 may be mounted to printed circuit 110. Components 112 may include radio-frequency filter circuitry, switching circuitry, tunable and/or fixed impedance matching circuitry, amplifier circuitry, transceiver circuitry, and other circuitry. Traces 108 in printed circuit 110 may be used to interconnect components 112.

Traces 104 and 108 may include conductive structures for forming transmission line paths (e.g., paths 54A and 54B of FIG. 3). For example, traces 104 and 108 may be used to form microstrip transmission lines or other transmission line structures. Parts of transmission lines 54A and 54B may also be formed using other transmission line structures (e.g., segments of coaxial cable transmission lines, segments of flexible printed circuit microstrip transmission line structures or other transmission lines formed from flex circuit substrates).

Printed circuit board 110 may be used to form antenna feed structures for the antenna feed for antenna 40 (e.g., feed FA and/or feed FB). For example, conductive traces 108 may be used to form an antenna signal path such as positive antenna feed signal path 58A of FIG. 3 that bridges gap 82 and may be used in forming ground structures such as ground path 56A of FIG. 3. Traces 108 may include surface traces such as traces 120 for coupling traces 108 to peripheral conductive housing structure 16 via metal screw 114 or other conductive fastener.

Screw 114 may have a head that is used to screw a portion of flexible printed circuit 110 into place against inner surface 140 of peripheral conductive housing structures 16. Screw 114 may also have a threaded shaft such as shaft 118 that screws into threads in threaded hole 116 in peripheral conductive housing structure 16. The conductive structures in the vicinity of screw 114 may form positive antenna feed terminal + for antenna feed FA. In antenna configurations with multiple feeds, additional screws may form additional positive antenna feed terminals. For example, in a configuration in which antenna 40 has a second antenna feed FB, an additional screw (screw 114' of FIG. 9) may be used in forming positive antenna feed terminal + for feed FB. Traces 108 may be used in routing antenna signals to the terminals of both feed FA and feed FB.

If desired, traces 108 may be coupled to peripheral conductive housing structure 16 using welds, solder, conductive adhesive, fasteners other than screws, or other suitable attachment mechanisms. The configuration of FIG. 7 in which conductive traces 108 are coupled to peripheral conductive housing structures 16 using screw 114 is merely illustrative.

Because flexible printed circuit 110 has a substrate formed from a sheet of flexible polymer, flexible printed circuit 110 may be bent to form bend 142. In the vicinity of solder 106, where flexible printed circuit 110 is connected to printed circuit 102, flexible printed circuit 110 and printed circuit 102 may lie parallel to the X-Y plane. In the vicinity of screw 114, flexible printed circuit 110 may lie in the X-Z plane, perpendicular to the X-Y plane and parallel to inner surface 140 of peripheral conductive housing structure 16.

Figure 8:
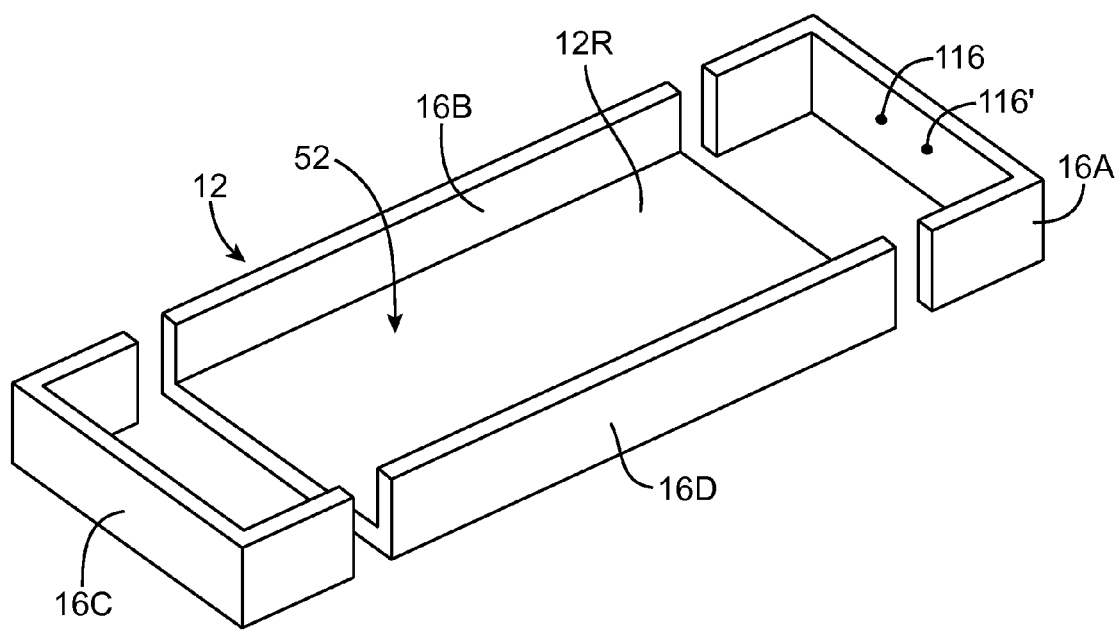
FIG. 8 is a perspective view of conductive housing structures that may be used in forming a device of the type shown in FIG. 1 in accordance with an embodiment of the present invention.

FIG. 8 is a perspective view of housing 12 showing how peripheral conductive housing structure 16 may be formed from segments such as segments 16A, 16B, 16C, and 16D that are separated by gaps 18. Holes 116 and 116' may be used to form threaded openings for screws 114 and 114' for the positive antenna feed terminals of feeds FA and FB, respectively. Segments 16A and 16C may be formed from U-shaped bands of metal (e.g., stainless steel, aluminum or other suitable conductive material). Segments 16B and 16D may form integral sidewall portions of planar rear housing member 12R of housing 12 and may be formed from a conductive material such as metal (e.g., stainless steel, aluminum, etc.). Other types of configurations for housing 12 may be used in device 10 if desired. The example of FIG. 8 is merely illustrative.

Figure 9:
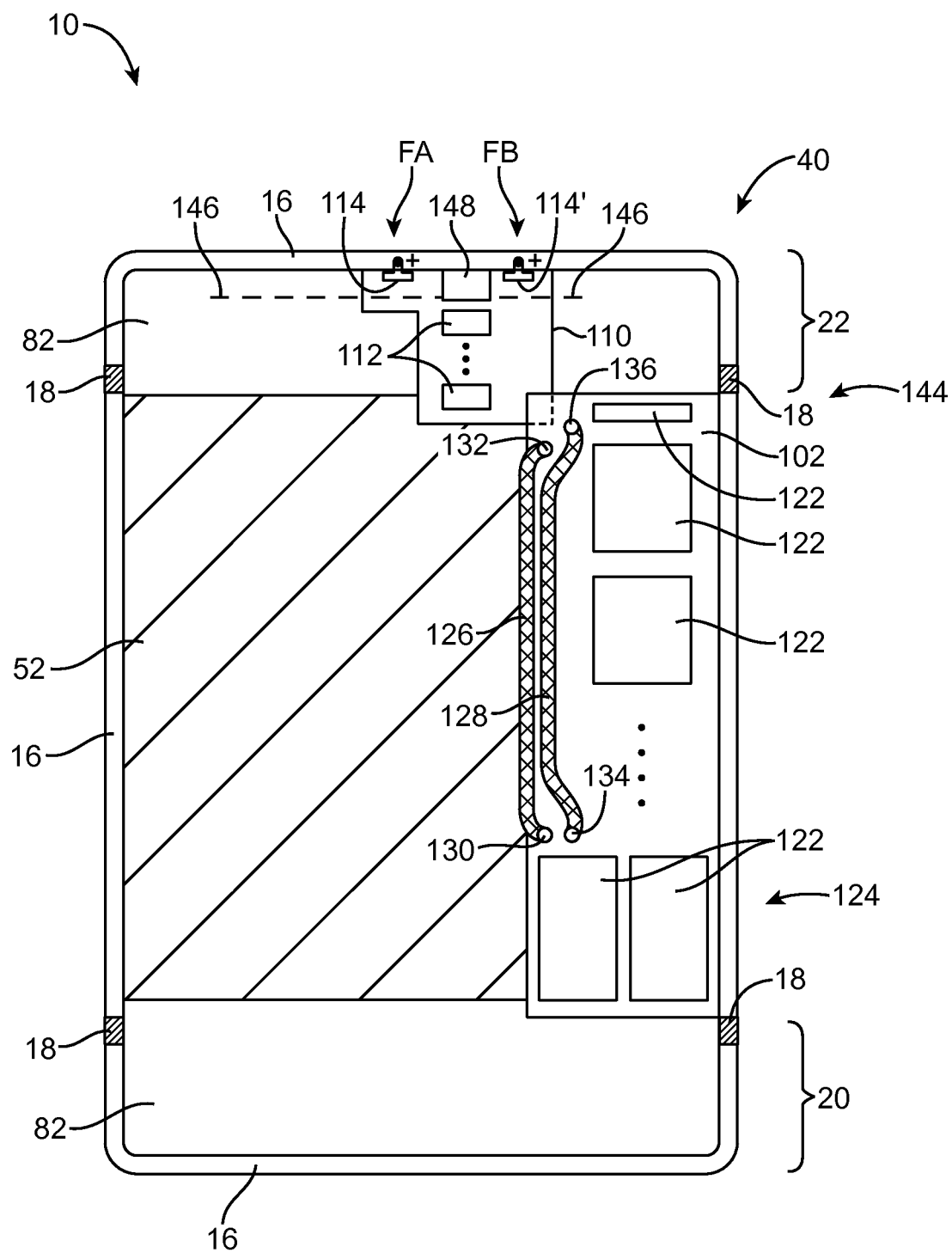
FIG. 9 is a top view of an electronic device with antenna structures that may use an antenna feed arrangement of the type shown in FIG. 7 in accordance with an embodiment of the present invention.

FIG. 9 is a top view of device 10 showing how flexible printed circuit 110 or other dielectric substrate (e.g., a rigid printed circuit board, plastic support structure, etc.) may be used in forming antenna feeds FA and FB in upper region 22 of housing 12. As shown in FIG. 9, components 122 may be mounted on printed circuit board 102. Components 122 may include control circuitry such as storage and processing circuitry 28 of FIG. 2 and input-output circuitry 30 of FIG. 2 (e.g., memory chips, processor chips, application-specific integrated circuits, radio-frequency transceiver circuitry, etc.).

Printed circuit board 102 may have an elongated shape with edges that run parallel to the longer edges of elongated device housing 12 of device 10 and may have first and second opposing ends 124 and 144. Wireless communications circuitry 34 such as cellular telephone transceiver circuitry 38, satellite navigation system receiver circuitry 35, and additional radio-frequency transceiver circuitry such as transceiver circuitry 36 may be mounted on board 102. For example, one or more transceiver integrated circuits may be mounted at end 124 of board 102.

Transmission lines such as transmission lines 126 and 128 may be used to route radio-frequency signals between transceiver circuitry in end region 124 and the antenna feed structures formed from printed circuit 110. Transmission lines 126 may include microstrip transmission lines, stripline transmission lines, coaxial cable transmission line, transmission lines formed from thin strips of flexible printed circuit substrate (e.g., microstrip transmission lines, stripline transmission lines, etc.), or other transmission lines. Traces 104 (FIG. 7) may be used to couple transceiver circuitry in region 124 to radio-frequency connectors such as connectors 130 and 134. At end 144 of printed circuit board 102, traces 104 may be coupled between radio-frequency connectors 132 and 136 and traces 108 on printed circuit 110 (e.g., via solder connections 106 formed using hot bar soldering techniques or other suitable connections).

Transmission line 126 may be coupled between connector 130 and connector 132. Transmission line 128 may be coupled between connector 134 and connector 136. Transmission line 126 may be used to route signals between a first transceiver in region 124 and antenna feed FA. Transmission line 128 may be used to route signals between a second transceiver in region 124 and antenna feed FB. Feed FA may have a screw such as screw 114 for coupling an antenna signal line formed from traces 108 on printed circuit 110 to peripheral conductive housing structure 16 and thereby forming a positive antenna feed terminal + for feed FA. Feed FB may have a screw such as screw 114' for coupling another antenna signal lines formed from traces 108 on printed circuit 110 to peripheral conductive housing structures 16 and thereby forming a positive antenna feed terminal + for feed FB. Printed circuit 110 may be sufficiently flexible to flex along bend axis 146. One or more openings such as opening 148 that overlap with bend axis 146 may be provided in printed circuit 110 to facilitate bending.

Figure 10:
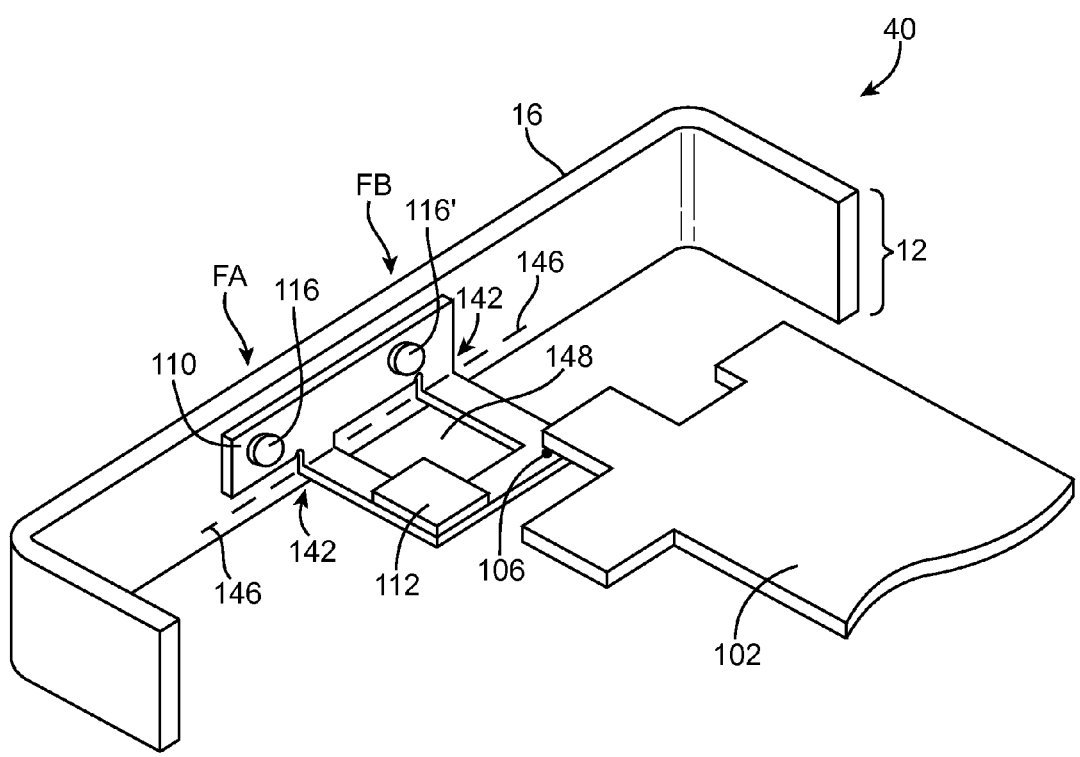
FIG. 10 is a perspective view of a portion of a device housing showing how a device with an antenna structure of the type shown in FIG. 9 may be provided with an antenna feed arrangement of the type shown in FIG. 7 in accordance with an embodiment of the present invention.

FIG. 10 is a perspective view of flexible printed circuit 110 of FIG. 9, showing how flexible printed circuit 110 may be used to form antenna feed structures for antenna feeds FA and FB in antenna 40. As shown in FIG. 10, flexible printed circuit 110 may have one or more openings such as opening 148. Opening 148 may be configured to overlap bend axis 146. By removing the polymer material of opening 148 from flexible printed circuit 110 along axis 146, the flexibility of flexible printed circuit 110 may be enhanced. This may help flexible printed circuit 110 bend along axis 146 to form bend 142.

Solder connections such as solder connection 106 of FIG. 10 may be used to interconnect the conductive signal paths in printed circuit board 102 (e.g., the positive and ground paths such as paths 58A and 56A of path 54A and paths 58B and 56B of path 54B of FIG. 3) to corresponding signal lines in printed circuit board 110 (e.g., traces 108). The positive signal line for each feed may extend across gap 82, as shown by lines 150 and 152 of FIG. 6. Ground antenna signal traces, positive antenna signal traces, and power supply lines (positive and ground) may also be provided on flexible printed circuit 110 to couple components 112 to printed circuit board 102.

Figure 11:
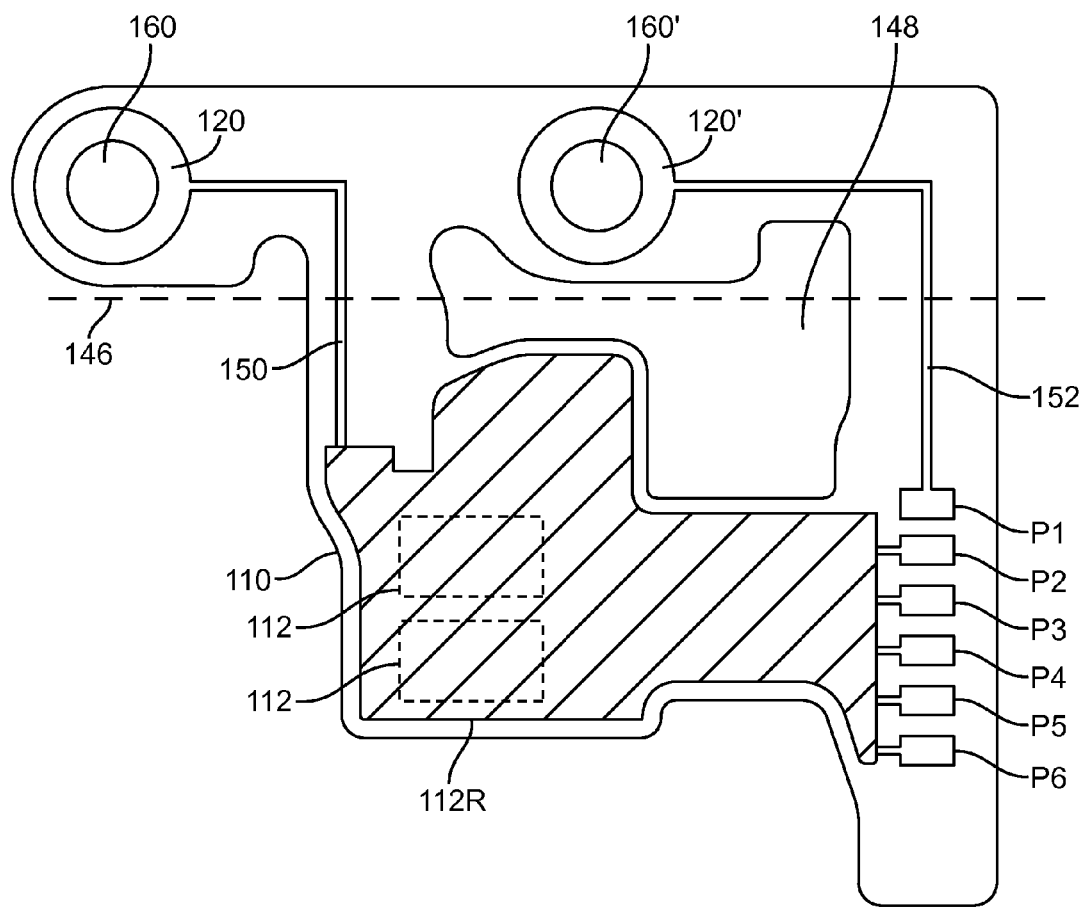
FIG. 11 is a top view of an illustrative flexible printed circuit of the type that may be used in forming an antenna feed structure with a low noise amplifier and other electrical components in accordance with an embodiment of the present invention.

A top view of illustrative antenna feed structures of the type that may be formed using printed circuit board 110 is shown in FIG. 11. As shown in FIG. 11, printed circuit board 110 may have opening such as screw hole openings 160 and 160'. When mounted in device 10, the shaft of screw 114 for feed FA may pass through opening 160 until the head of screw 114 bears against conductive traces 120 to short conductive traces 120 for positive antenna signal line 150 and positive antenna feed terminal + of feed FA to peripheral conductive housing structure 16. The shaft of screw 114' for feed FB may pass through opening 160' to short conductive traces 120' for positive antenna signal line 152 and positive antenna feed terminal + of feed FB to peripheral conductive housing structure 16.

Electrical components 112 may be mounted to flexible printed circuit substrate 110 in region 112R. For example, components such as matching circuits M1, M2, M3, and/or M4, band pass filter 64A, and low noise amplifier 86 of FIG. 6 and/or other electrical components may be mounted on flexible printed circuit 110 in region 112R.

By mounting low noise amplifier 86 near end 144 of printed circuit board 102 adjacent to feed FA rather than at end 124 of printed circuit board 102 near the radio-frequency transceivers at end 124, performance can be enhanced for receiver 35. This is because incoming antenna signals from feed FA will be amplified by low noise amplifier 86 before being subjected to losses due to the presence of connector 132, transmission line 126 (e.g., a transmission line having a length of 2-20 cm, more than 2 cm, about 4-15 cm, less than 10 cm, etc.), and connector 130. Incurring attenuation due to the presence of the signal path (54A) through connector 132, transmission line structure 126, and connector 130 only after antenna signals have been amplified by low noise amplifier 86 can help enhance the signal-to-noise ratio of the received signal that is presented to the input of receiver at end 124 of printed circuit 144 (e.g., receiver 35).

In general, the antenna feed structure formed from flexible printed circuit 110 may include any suitable number of low noise amplifiers (LNAs) for amplifying incoming antenna signals. In the configuration of FIG. 9, feed FA may, for example, be provided with a low noise amplifier (i.e., low noise amplifier 86 of FIG. 6) and associated filter and matching circuitry (e.g., band pass filter 64A of FIG. 6) that are mounted on printed circuit 110. One or more of the components associated with feed FB such as matching networks M2 and M3, filter 64B, antenna selection switch 88, and/or filters 90 may also be mounted on flexible printed circuit 110, if desired. Electrical components that are not mounted on printed circuit 110 may be mounted on printed circuit board 102 upstream or downstream of transmission line 126 and 128.

Pads P1, P2, P3, P4, P5, and P6 may be coupled to traces in printed circuit 110 (e.g., traces 108 of FIG. 7) and, via solder connections 106, may be coupled to respective traces 104 in printed circuit board 102. Traces 108 may include positive and ground antenna signal traces for routing radio-frequency signals for feeds FA and FB and traces for routing positive and ground power supply voltages (e.g., for powering circuitry such as low noise amplifier 86, etc.). With one suitable arrangement, pad P1 may be coupled to a trace that forms positive antenna signal path 152 for feed FB. Pads P2, P3, and P5 may be coupled to ground traces. Pad P4 may be coupled to a trace that forms a positive antenna signal path. This path may start at conductor 120 of antenna feed FA, may pass through path 150 of FIG. 11, band pass filter 64A, and low noise amplifier 86, and may terminate at pad P4. Pad P6 may be used to supply power (e.g., a positive power supply voltage or other suitable power supply signal) to low noise amplifier 86 and other circuitry on printed circuit 110.

Figure 12:
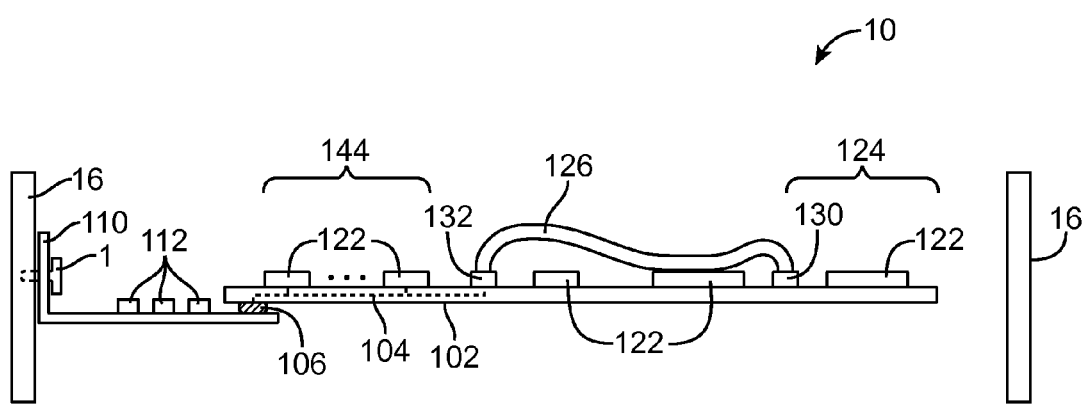
FIG. 12 is a cross-sectional side view of an electronic device having a feed structure formed from a flexible substrate with attached electrical components such as a low noise amplifier in accordance with an embodiment of the present invention.

A cross-sectional side view of device 10 showing how printed circuit 110 may be coupled to printed circuit 102 using solder connections 106 (e.g., solder connections formed using hot bar soldering techniques) is shown in FIG. 12.

The foregoing is merely illustrative of the principles of this invention and various modifications can be made by those skilled in the art without departing from the scope and spirit of the invention.

What is claimed is:

1. An electronic device having peripheral edges, comprising:
   a display having a display cover layer;
   antenna structures that include an inverted-F antenna resonating element that extends along at least a given one of the peripheral edges of the electronic device, wherein the display cover layer has a portion that overlaps the inverted-F antenna resonating element;
   a flexible printed circuit having transmission line structures for the inverted-F antenna resonating element; and
   a fastening structure that secures the flexible printed circuit to the antenna structures, wherein the flexible printed circuit has a bend.

2. The electronic device defined in claim 1, wherein the antenna structures further comprise:
   a signal feed terminal for the inverted-F antenna resonating element, wherein the transmission line structures on the flexible printed circuit are conductively coupled to the signal feed terminal.

3. The electronic device defined in claim 1, wherein the fastening structure comprises a conductive fastener.

4. The electronic device defined in claim 1, wherein the fastening structure comprises a screw.

5. The electronic device defined in claim 1, further comprising:
at least one impedance matching circuit for the antenna structures that is mounted to the flexible printed circuit.

6. The electronic device defined in claim 1, further comprising:
conductive housing side walls that extend perpendicular to a planar face of the display cover layer, wherein the flexible printed circuit has a first portion that extends substantially parallel to the conductive housing side walls and a second portion that extends substantially parallel to the planar face of the display cover layer.

7. The electronic device defined in claim 1, wherein the display further comprises a display module that emits light, the display cover layer has an additional portion, the portion of the display cover layer that overlaps the inverted-F antenna resonating element does not overlap the display module, and the additional portion of the display cover layer does not overlap the inverted-F antenna resonating element.

8. The electronic device defined in claim 1, wherein the bend is adjacent to the antenna structures.

9. An electronic device having peripheral edges, comprising:
a display having a display cover layer;
antenna structures that include an inverted-F antenna resonating element that extends along at least a given one of the peripheral edges of the electronic device, wherein the display cover layer has a portion that overlaps the inverted-F antenna resonating element;
a flexible printed circuit having transmission line structures for the inverted-F antenna resonating element;
a fastening structure that secures the flexible printed circuit to the antenna structures;
a rigid printed circuit board coupled to the flexible printed circuit; and
radio-frequency transceiver circuitry on the rigid printed circuit board, wherein the transmission line structures are coupled between the radio-frequency transceiver circuitry and the inverted-F antenna resonating element.

10. An electronic device having peripheral edges, comprising:
a display having a display cover layer;
antenna structures that include an inverted-F antenna resonating element that extends along at least a given one of the peripheral edges of the electronic device, wherein the display cover layer has a portion that overlaps the inverted-F antenna resonating element;
a flexible printed circuit having transmission line structures for the inverted-F antenna resonating element; and
a fastening structure that secures the flexible printed circuit to the antenna structures,
wherein the flexible printed circuit comprises a conductive trace coupled to the transmission line structures and a hole in the conductive trace through which the fastening structure passes while securing the flexible printed circuit to the antenna structures.

11. An electronic device having a periphery, comprising:
peripheral conductive housing sidewall structures that surround the periphery of the electronic device, wherein the peripheral conductive housing sidewall structures form a portion of an antenna for the electronic device;
a display having a display cover layer, wherein a portion of the display cover layer adjacent to the periphery of the electronic device overlaps the peripheral conductive housing sidewall structures;
a flexible printed circuit;
at least one conductive line on the flexible printed circuit that forms part of an antenna feed for the antenna; and
a fastening structure that mates with a hole in the peripheral conductive housing sidewall structures and mechanically secures the flexible printed circuit to the peripheral conductive housing sidewall structures.

12. The electronic device defined in claim 11, wherein the peripheral conductive housing sidewall structures comprise first and second portions, the portion of the antenna comprises an antenna resonating element for the antenna, the first portion of the peripheral conductive housing sidewall structures comprises the antenna resonating element for the antenna, the second portion of the peripheral conductive housing sidewall structures comprises at least some of a ground plane for the antenna, and the first and second portions are separated by at least one dielectric filled gap.

13. The electronic device defined in claim 11, wherein the peripheral conductive housing sidewall structures have a first surface that extends parallel to a face of the display cover layer and a second surface that extends perpendicular to the first surface.

14. The electronic device defined in claim 13, wherein the flexible printed circuit has a first portion that extends substantially parallel to the first surface and a second portion that extends substantially parallel to the second surface.

15. An electronic device, comprising:
a display having a display module that emits light through a display cover layer;
peripheral conductive housing sidewall structures that surround the display module and that comprise external surfaces of the electronic device;
an antenna, wherein a portion of the peripheral conductive housing sidewall structures form at least a portion of the antenna; and
a flexible printed circuit board having traces that form part of a feed structure for the antenna, wherein the flexible printed circuit board comprises a bend adjacent to the peripheral conductive housing sidewall structures.

16. The electronic device defined in claim 15, wherein the display cover layer has a first portion that overlaps the display module without overlapping the peripheral conductive housing sidewall structures and a second portion that overlaps the peripheral conductive housing sidewall structures and the flexible printed circuit without overlapping the display module.

17. The electronic device defined in claim 15, further comprising:
a fastening structure that affixes the flexible printed circuit board to the peripheral conductive housing sidewall structures.

18. The electronic device defined in claim 17, wherein the peripheral conductive housing sidewall structures comprise a threaded hole that is configured to receive a threaded portion of the fastening structure.

19. The electronic device defined in claim 17, wherein the fastening structure affixes the flexible printed circuit board to the peripheral conductive housing sidewall structures at a first location on the peripheral conductive housing structures, the electronic device further comprising:
an additional fastening structure that affixes the flexible printed circuit board to the peripheral conductive housing sidewall structures at a second location on the peripheral conductive housing sidewall structures that is different from the first location.

* * * * *